(12) United States Patent
Pang et al.

(10) Patent No.: US 9,583,198 B1
(45) Date of Patent: Feb. 28, 2017

(54) WORD LINE-DEPENDENT AND TEMPERATURE-DEPENDENT PASS VOLTAGE DURING PROGRAMMING

(71) Applicant: SanDisk Technologies Inc., Plano, TX (US)

(72) Inventors: Liang Pang, Fremont, CA (US);
Yingda Dong, San Jose, CA (US);
Jiahui Yuan, Fremont, CA (US);
Jingjian Ren, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/136,429

(22) Filed: Apr. 22, 2016

(51) Int. Cl.
*G11C 16/00* (2006.01)
*G11C 16/10* (2006.01)
*G11C 16/04* (2006.01)
*G11C 16/28* (2006.01)

(52) U.S. Cl.
CPC .......... *G11C 16/10* (2013.01); *G11C 16/0483* (2013.01); *G11C 16/28* (2013.01)

(58) Field of Classification Search
None
See application file for complete search history.

(56) References Cited

U.S. PATENT DOCUMENTS

| | | | |
|---|---|---|---|
| 6,801,454 B2 | 10/2004 | Wang et al. | |
| 7,277,355 B2 | 10/2007 | Tanzawa et al. | |
| 7,391,650 B2 | 6/2008 | Mokhlesi et al. | |
| 7,460,407 B2 | 12/2008 | Mokhlesi et al. | |
| 7,583,535 B2 | 9/2009 | Sekar et al. | |
| 8,228,739 B2 | 7/2012 | Pan et al. | |
| 8,526,233 B2 | 9/2013 | Hemink et al. | |
| 8,582,381 B2 | 11/2013 | Oowada et al. | |
| 8,638,608 B2 | 1/2014 | Lai et al. | |
| 9,001,579 B2 | 4/2015 | Song et al. | |
| 2005/0078537 A1 | 4/2005 | So et al. | |
| 2009/0316489 A1 | 12/2009 | Han | |
| 2010/0110793 A1* | 5/2010 | Kim | G11C 5/143 365/185.18 |
| 2011/0286274 A1* | 11/2011 | Chang | G11C 16/3418 365/185.17 |

(Continued)

OTHER PUBLICATIONS

U.S. Appl. No. 14/976,107, filed Dec. 21, 2015.

*Primary Examiner* — Kretelia Graham
(74) *Attorney, Agent, or Firm* — Vierra Magen Marcus LLP

(57) ABSTRACT

Techniques are provided for avoiding over-programming which can occur on memory cells connected to a data word line at a source-side of a block of word lines. A gradient in the channel potential is created during a program voltage between the data word line and an adjacent dummy word line. This gradient generates electron-hole pairs which can contribute to over programming, where the over programming is worse at higher temperatures. In one aspect, pass voltages of unselected word lines are set to be relatively lower when the temperature is relatively higher, and when the selected word line is among a set of one or more source-side word lines. On the other hand, the pass voltages are set to be relatively higher when the temperature is relatively higher, and when the selected word line is not among the one or more source-side word lines.

19 Claims, 20 Drawing Sheets

(56) References Cited

U.S. PATENT DOCUMENTS

2012/0287711 A1* 11/2012 Kim .................... G11C 11/5642
365/185.03
2012/0300550 A1* 11/2012 Hemink ............. G11C 16/3427
365/185.17

* cited by examiner

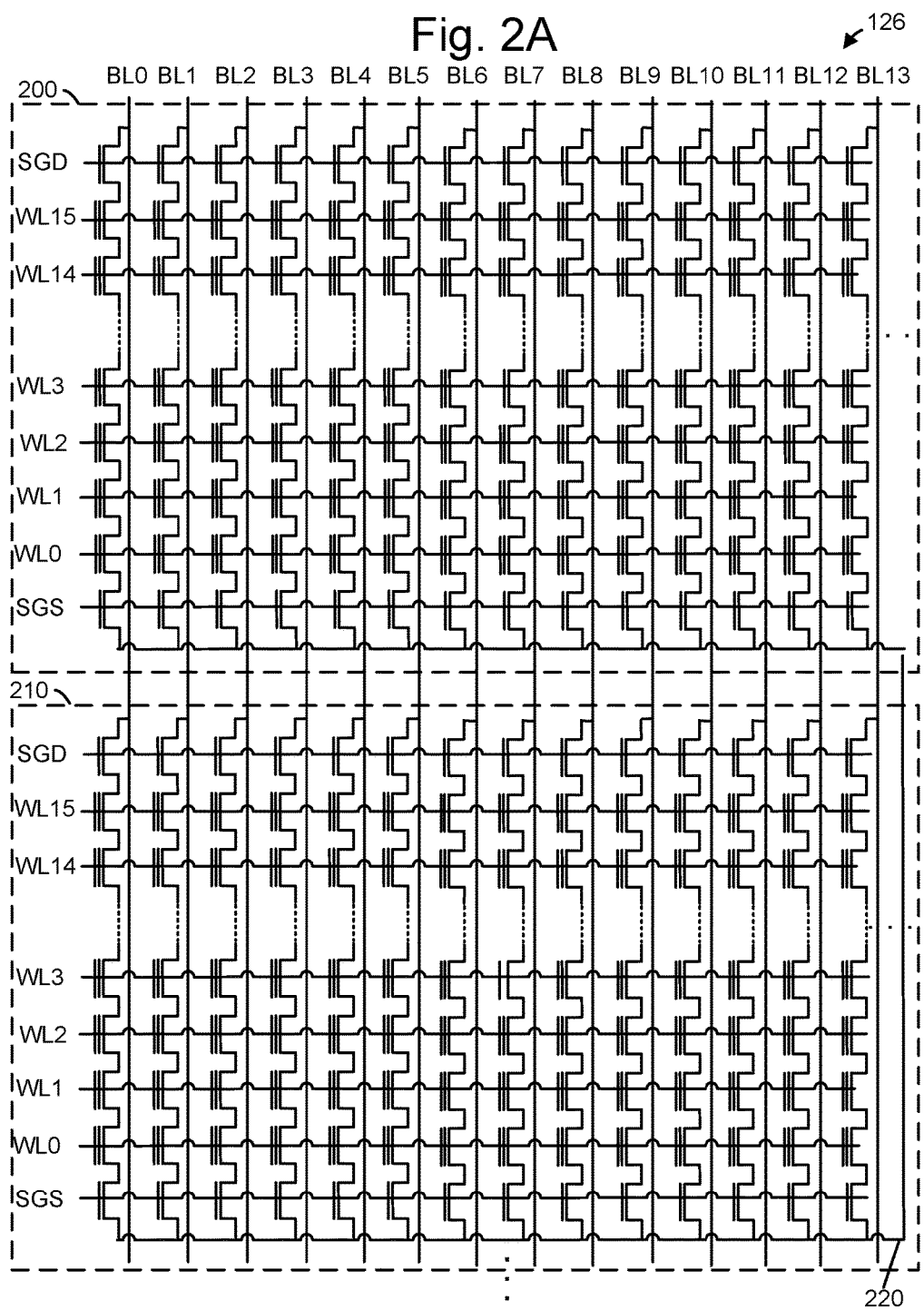

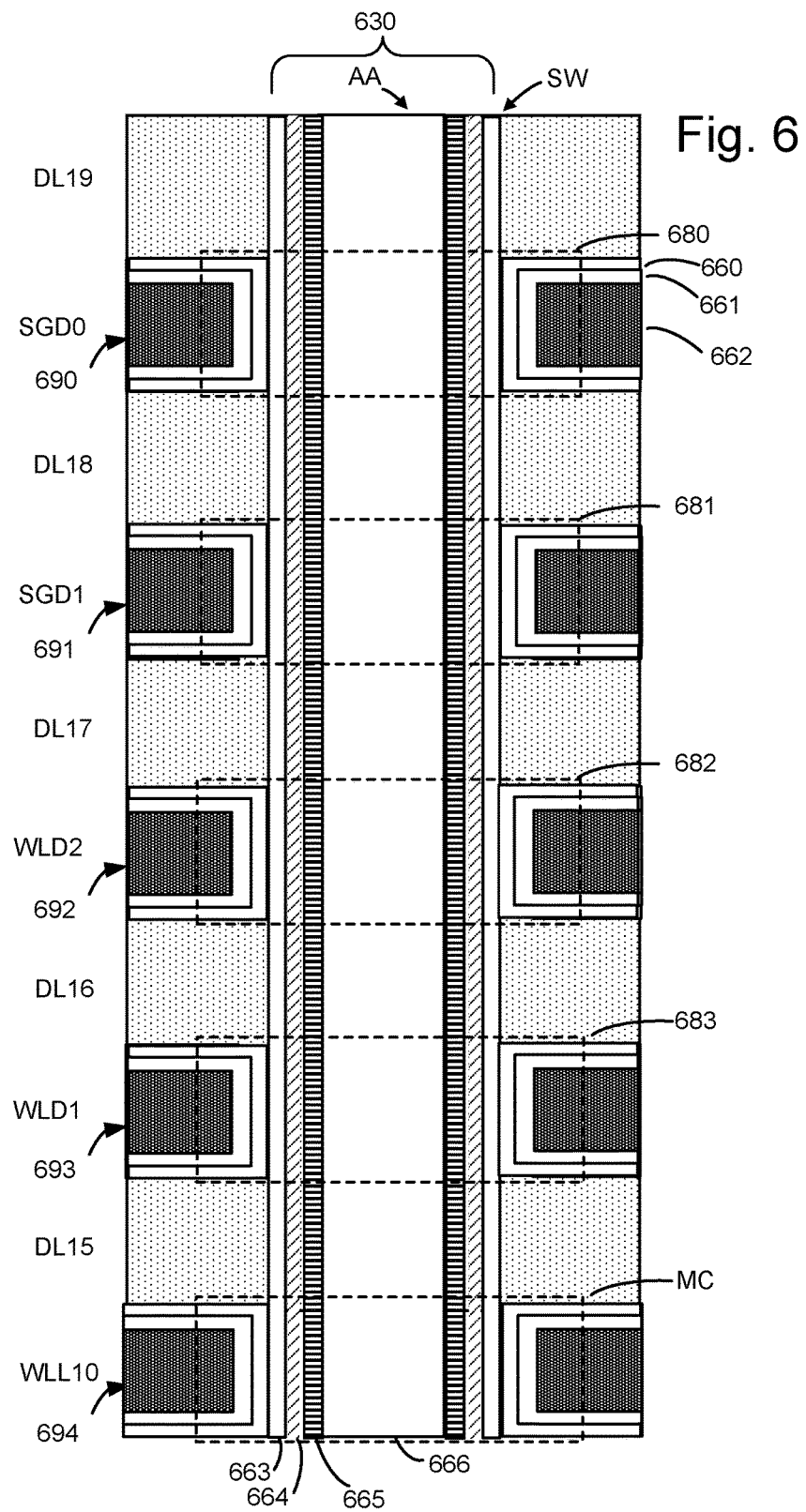

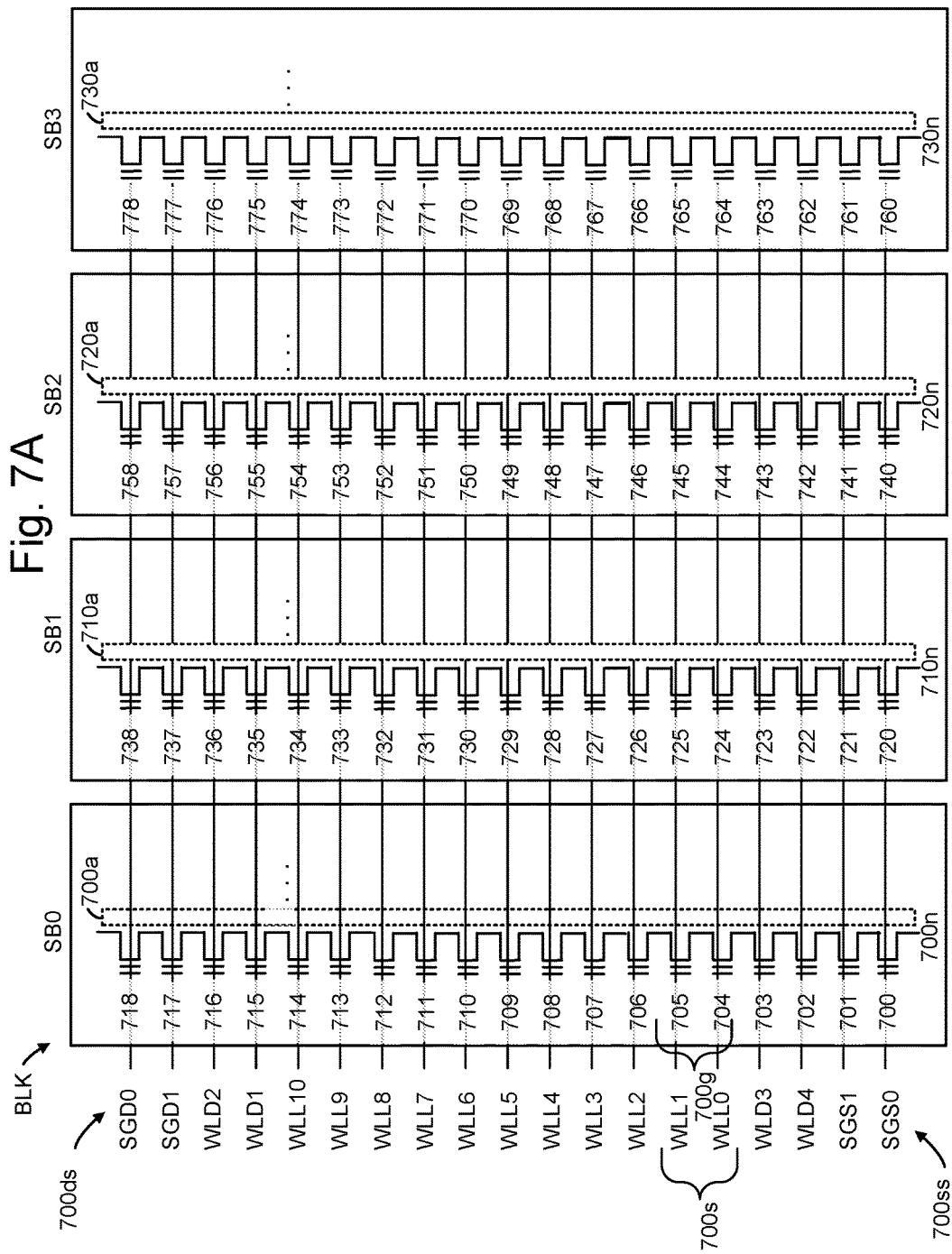

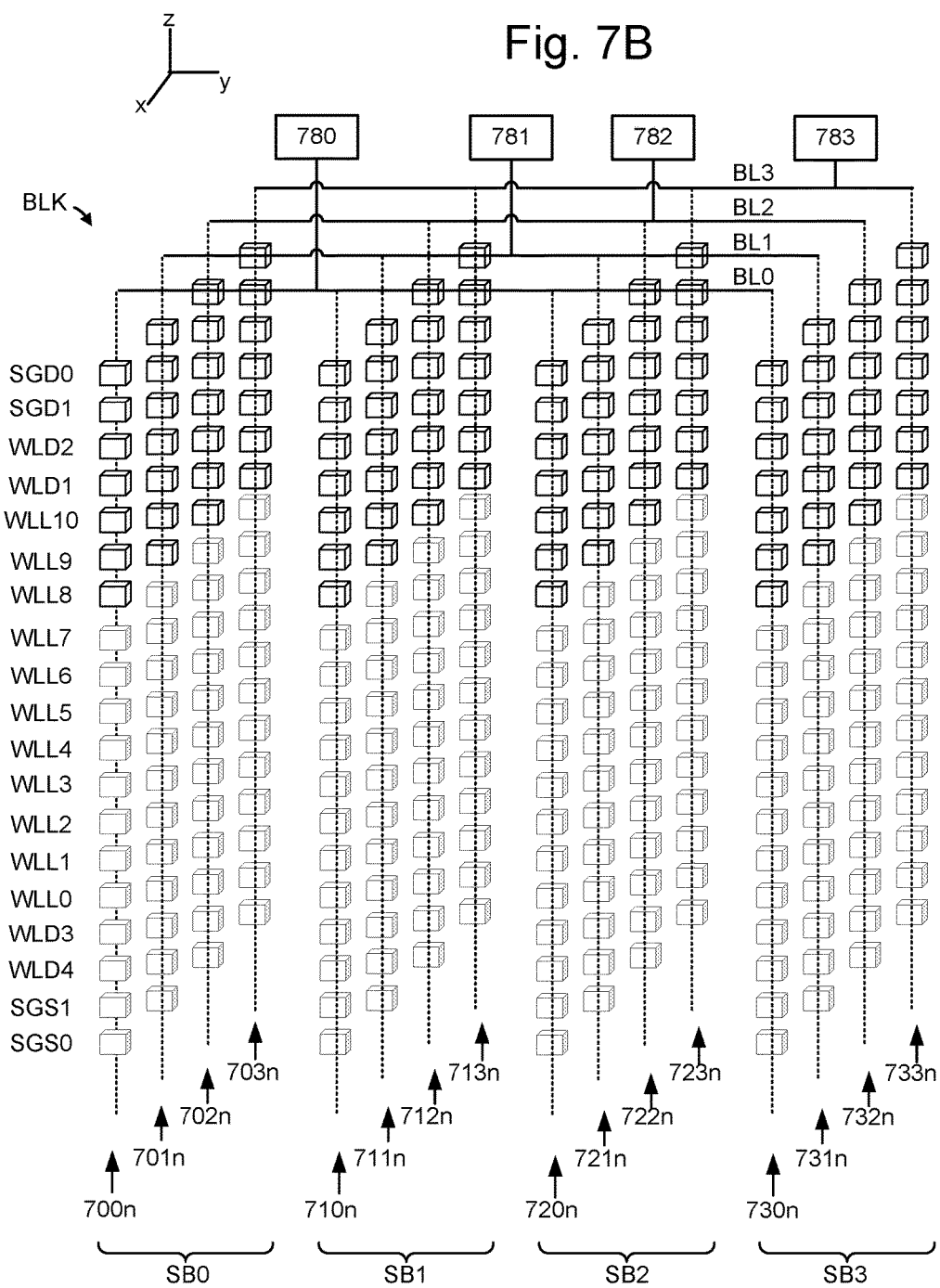

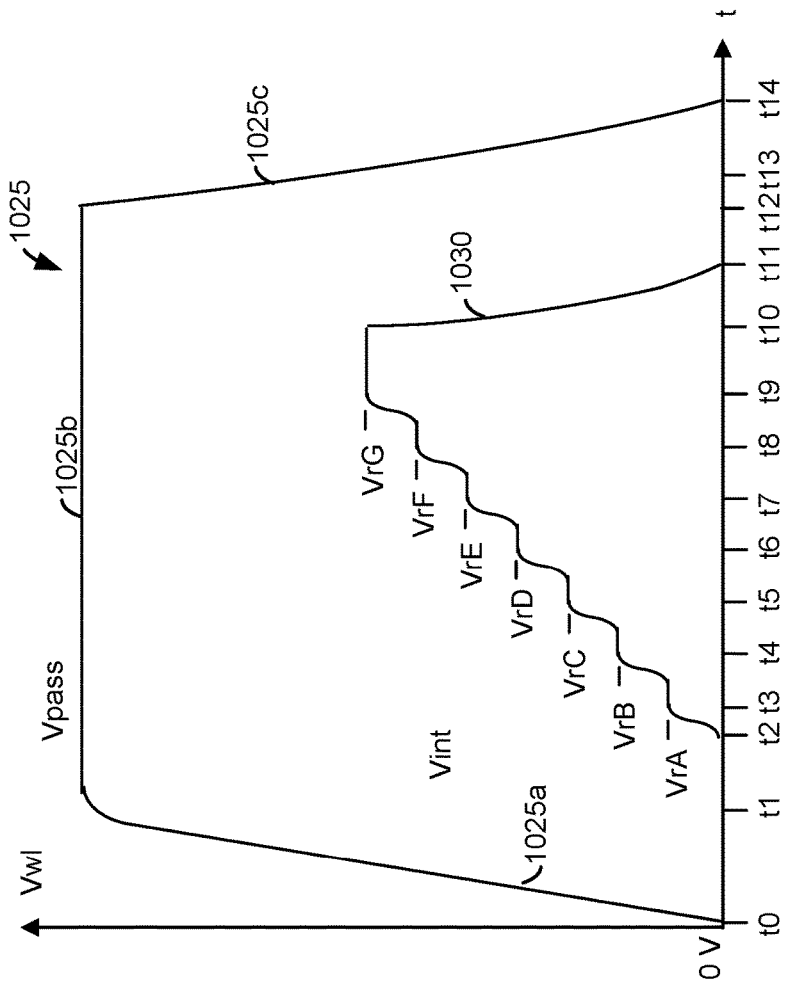

WORD LINE-DEPENDENT AND TEMPERATURE-DEPENDENT PASS VOLTAGE DURING PROGRAMMING

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 2A depicts blocks of memory cells in an example 2D configuration of the memory structure 126 of FIG. 1A.

FIG. 6 depicts a close-up view of the region 622 of the stack of FIG. 4.

FIG. 7A depicts an example view of NAND strings in sub-blocks in a 3D configuration which is consistent with FIG. 4.

FIG. 7B depicts additional detail of the sub-blocks SB0-SB3 of FIG. 8A.

FIG. 10B depicts a plot of example waveforms in a read operation.

DETAILED DESCRIPTION

Techniques are provided for improving the accuracy of programming operations in a memory device. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control line (e.g., word line) which acts a control gate. A set of word lines extends from the source side of a block to the drain side of a block. Memory cells can be connected in other types of strings and in other ways as well.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

Figure 9:
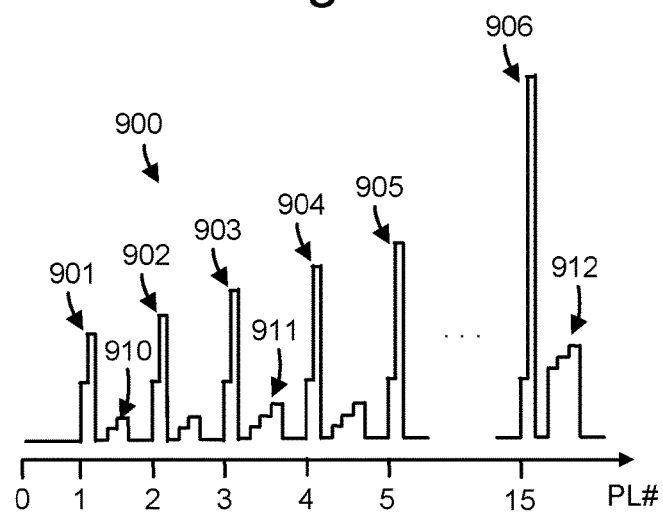
FIG. 9 depicts a waveform of an example programming operation.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state (Eslc) and the programmed state (Pslc) (see FIG. 8A). In a two-bit per cell memory device, there are four data states including the erased state and three higher data states referred to as the A, B and C data states (see FIG. 8B). In a three-bit per cell memory device, there are eight data states including the erased state and seven higher data states referred to as the A, B, C, D, E, F and G data states (see FIG. 8C). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states (see FIG. 8D) where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, memory cells can be inadvertently programmed when the program voltage is applied. For example, a memory cell connected to a selected word line in a selected or unselected string, or to an unselected word line, can be inadvertently programmed. Inadvertent programming, or program disturb, can be caused by capacitive coupling from one or more word lines to one or more memory cells. For example, memory cells of the unselected NAND strings can be disturbed by voltages applied to word lines which are shared by the unselected NAND strings and the selected NAND strings. Memory cells which are to remain in the erased state based on the write data are most susceptible to program disturb. Program disturb causes increases their threshold voltage (Vth) and can result in a read error. To reduce program disturb, the channel of the unselected NAND string is boosted before the program voltage is applied. The boosting is primary provided by an increase in pass voltages (Vpass) of the unselected word lines, e.g., from 0 V to 8-10 V. This increase is coupled to the channel. Moreover, the select gate transistors at each end of the unselected NAND string are provided in a non-conductive state so that the channel voltages can float higher due to the capacitive coupling.

In one type of program disturb, a memory cell has a potential difference between the control gate or word line and the channel which results in an electric field across the charge storing region which can drive electrons into the charge storing region, thereby increasing the Vth. Program disturb results in a Vth which is higher than desired at the end of a programming operation.

In another type of program disturb, over-programming can occur on memory cells connected to a word line at a source-side of a block of word lines due to a gradient in the channel potential. Typically, when a program voltage is applied to the selected word line during each program loop in a multi-loop program operation, a large gradient in the channel potential is created in a portion of a channel material which is between the selected word line and an adjacent word line. This gradient generates electron-hole pairs which can contribute to over programming. This effect is particularly noticeable when the selected word line is a source-side word line, in which case the adjacent word line is a dummy word line. The electrons can travel as hot carriers into the charge-storing material of a memory cell and increase its Vth. The channel gradient is a change in the potential in the channel material, e.g., polysilicon, which typically runs the length of the string. Further, it has been observed that over-programming is worse for the memory cells connected to the source-side word lines at higher temperatures.

Techniques provided herein address the above and other issues. In one aspect, the pass voltages are set to be relatively lower when the temperature is relatively higher, and when the selected word line is among a set of one or more source-side word lines. The reduced pass voltages help reduce capacitive coupling between the unselected word lines and the channel so that the channel potential under the selected word line reduced. As a result, the channel gradient and the resulting hot carrier injection is reduced. The channel potential under the unselected word lines is also reduced, so that the likelihood of program disturb of the respective memory cells may increase, but this is considered to be an acceptable tradeoff.

On the other hand, the pass voltages are set to be relatively higher when the temperature is relatively higher, and when the selected word line is not among the one or more source-side word lines. In this case, the primary concern is counteracting the reduced channel boosting which occurs with higher temperatures. The higher pass voltages result in greater coupling to the channel to prevent this degradation. See also FIG. 8G.

In another aspect, the adjustment to the pass voltage is a function of a magnitude of the program voltage. See also FIGS. 14A and 14B.

Various other features and benefits are described below.

Figure 1A:
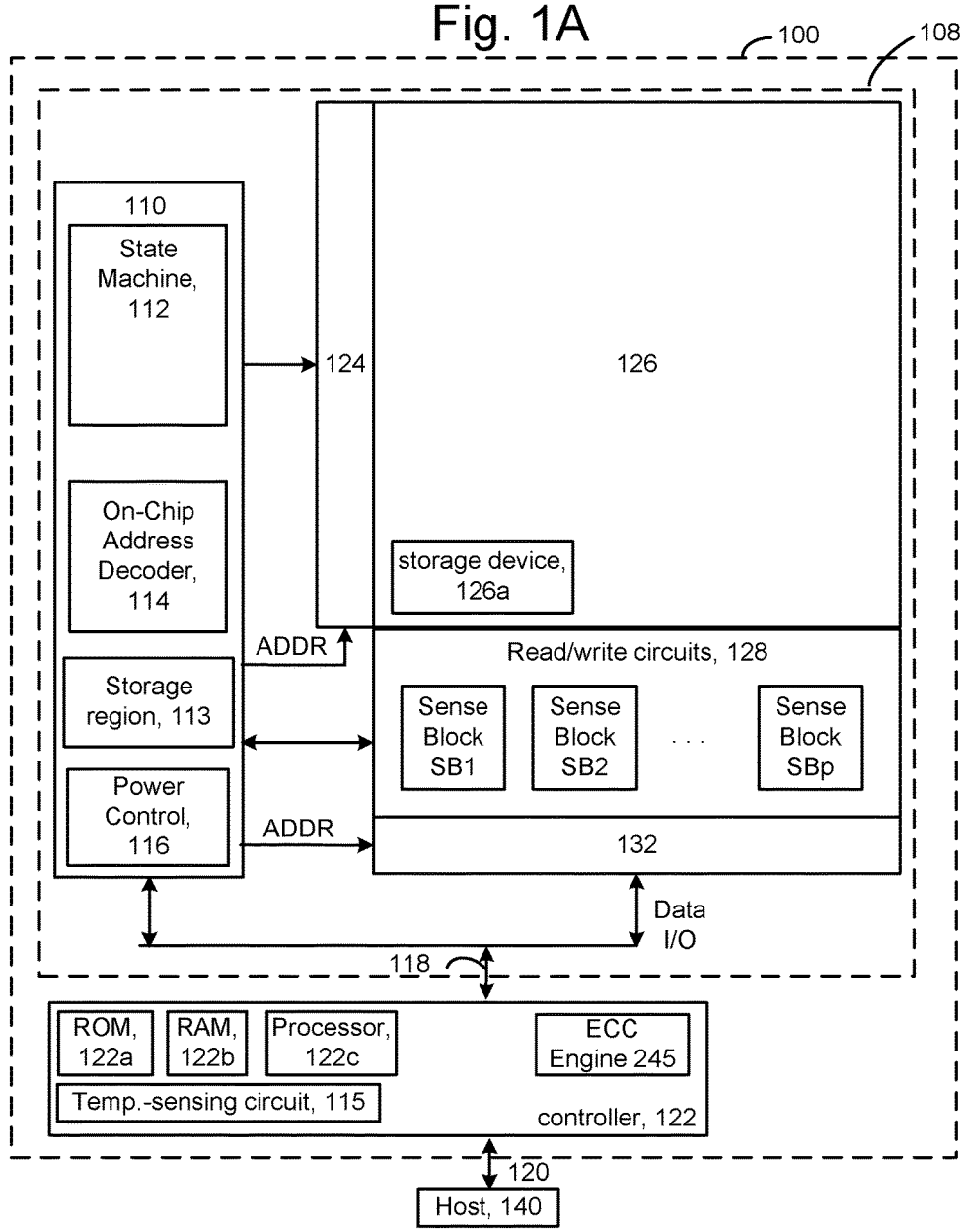
FIG. 1A is a block diagram of an example memory device.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for program and read parameters as described further below.

The on-chip address decoder 114 provides an address interface between that used by the host or a memory controller to the hardware address used by the decoders 124 and 132. The power control module 116 controls the power and voltages supplied to the word lines, select gate lines and bit lines during memory operations. It can include drivers for word lines, SGS and SGD transistors and source lines. See FIG. 15. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein. For example, a control circuit may include any one of, or a combination of, control circuitry 110, state machine 112, decoders 114 and 132, power control module 116, sense blocks SBb, SB2, . . . , SBp, read/write circuits 128, controller 122, and so forth.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. The ECC engine may be used to count of number of errors in a read operation and use this number to determine whether to perform a coupling up of word lines, as discussed further below.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein.

The controller 122 may also include a temperature-sensing circuit 115 which is used by the processor 122c to set temperature-based parameters such as the pass voltage. For example, the controller may provide a digital signal to the power control module 116 to set a pass voltage in response to a temperature indicated by an output of the temperature-compensation circuit. See also FIG. 1B.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
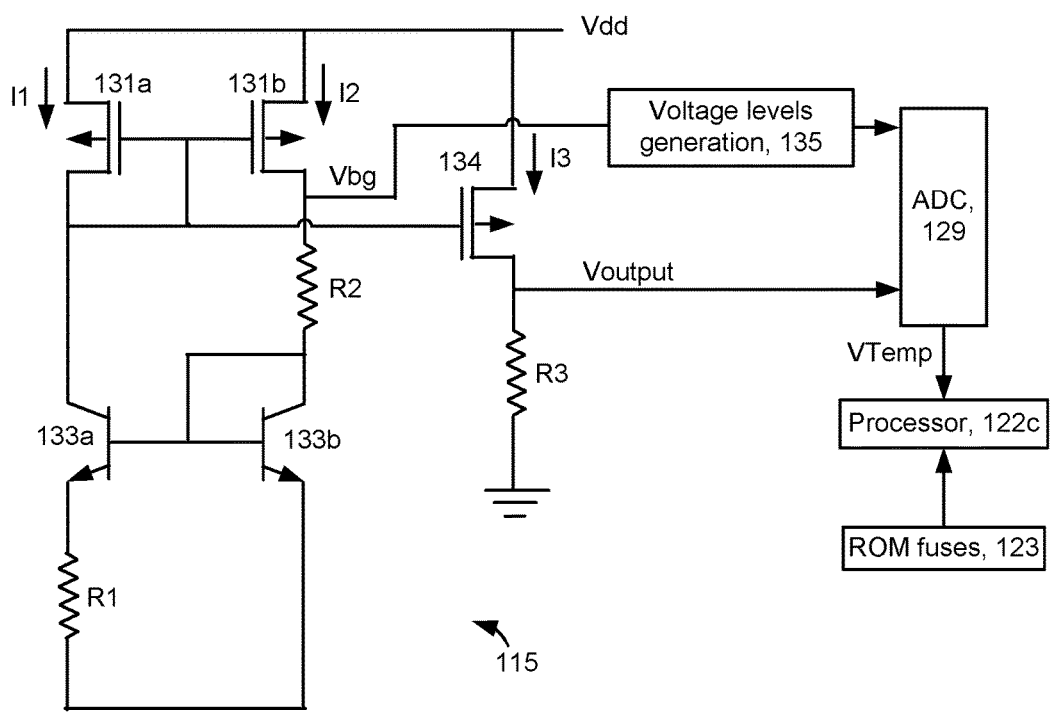
FIG. 1B depicts an example of the temperature-sensing circuit 115 of FIG. 1B.

FIG. 1B depicts an example of the temperature-sensing circuit 115 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

FIG. 2A depicts blocks of memory cells in an example 2D configuration of the memory structure 126 of FIG. 1. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. Other types of non-volatile memory can also be used. For example, a charge-trapping memory cell may use a non-conductive dielectric material in place of a conductive floating gate to store charge in a non-volatile manner. In an example, a triple layer dielectric formed of silicon oxide, silicon nitride and silicon oxide ("ONO") is sandwiched between a conductive control gate and a semiconductor. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 2B:
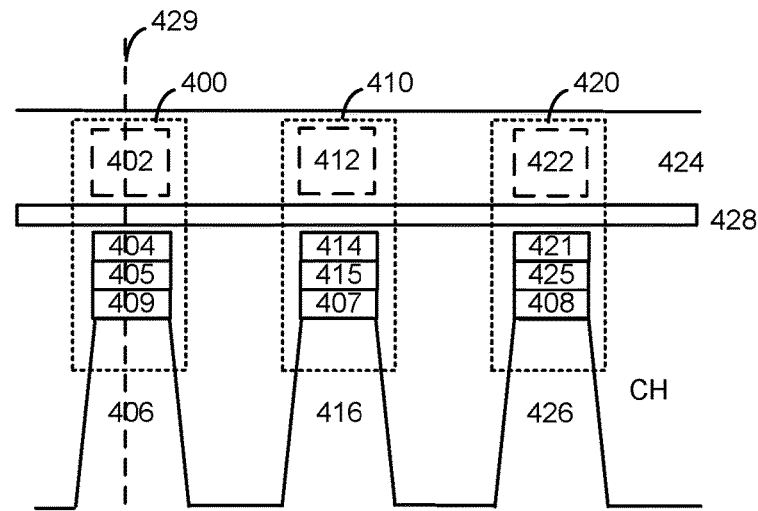
FIG. 2B depicts a cross-sectional view of example charge-trapping memory cells in NAND strings, as an example of memory cells in FIG. 2A.

FIG. 2B depicts a cross-sectional view of example charge-trapping memory cells in NAND strings, as an example of memory cells in FIG. 2A. The view is in a word line direction of memory cells comprising a flat control gate and charge-trapping regions as a 2D example of memory cells in the memory structure 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

One advantage of a flat control gate is that the charge-trapping layer can be made thinner than a floating gate. Additionally, the memory cells can be placed closer together.

Figure 2C:
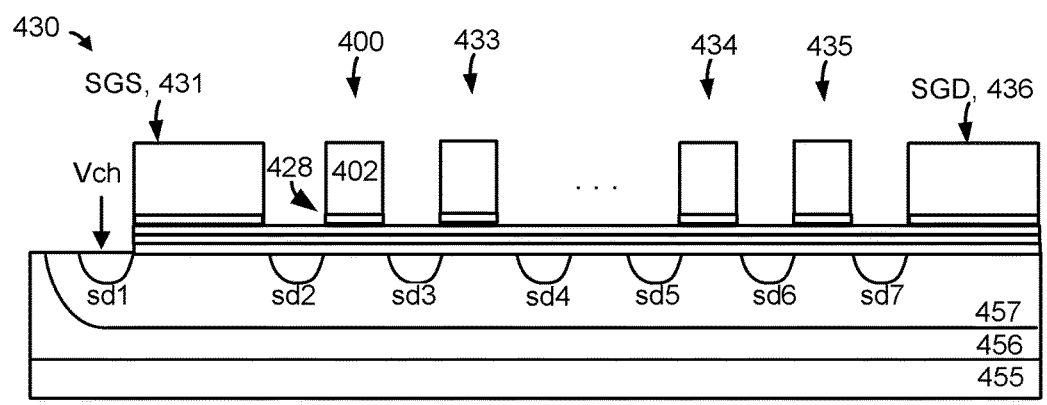
FIG. 2C depicts a cross-sectional view of the structure of FIG. 2B along line 429.

FIG. 2C depicts a cross-sectional view of the structure of FIG. 2B along line 429. The view shows a NAND string 430 having a flat control gate and a charge-trapping layer. The NAND string 430 includes an SGS transistor 431, example memory cells 400, 433, . . . , 434 and 435, and an SGD transistor 436.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

Figure 2D:
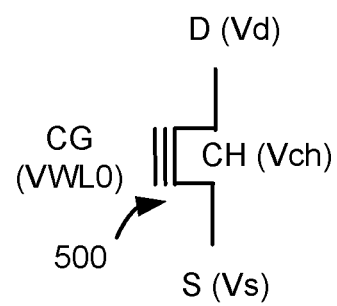
FIG. 2D depicts an example memory cell 500.

FIG. 2D depicts an example memory cell 500. The memory cell comprises a control gate CG which receives a word line voltage Vwll0, a drain at a voltage Vd, a source at a voltage Vs and a channel at a voltage Vch.

Figure 3:
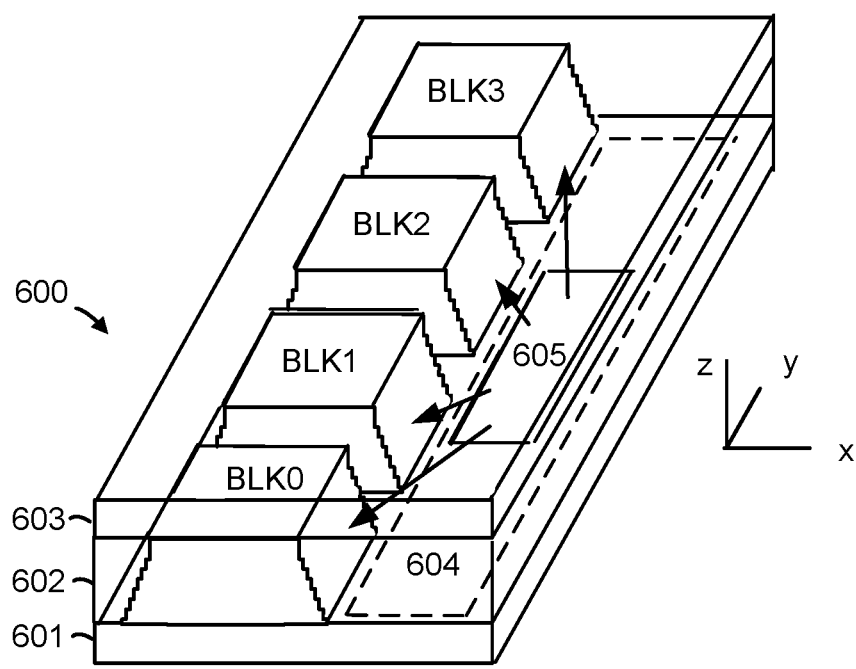
FIG. 3 is a perspective view of a memory device 600 comprising a set of blocks in an example 3D configuration of the memory structure 126 of FIG. 1A.

FIG. 3 is a perspective view of a memory device 600 comprising a set of blocks in an example 3D configuration of the memory structure 126 of FIG. 1A. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 4:
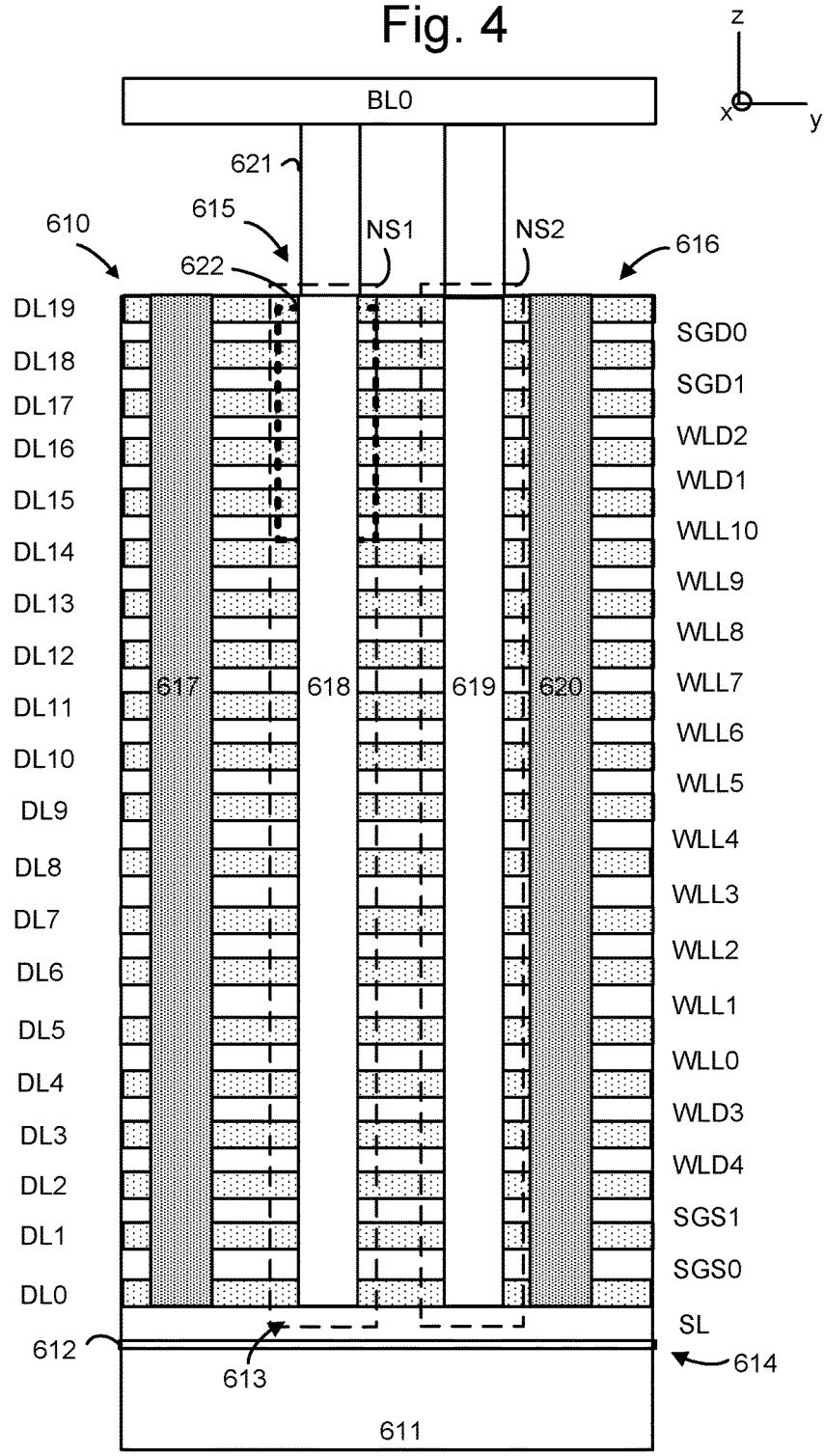
FIG. 4 depicts an example cross-sectional view of a portion of one of the blocks of FIG. 5.
Figure 5:
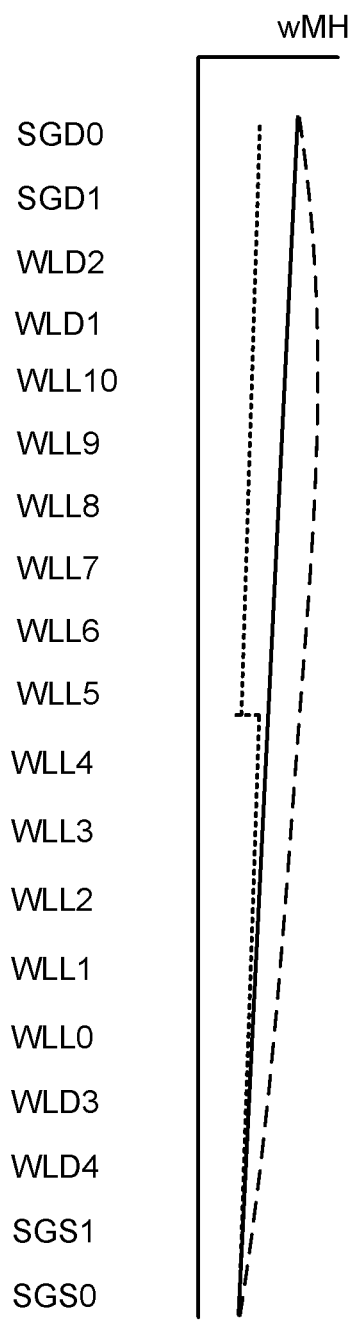
FIG. 5 depicts a plot of memory hole diameter in the stack of FIG. 4.

FIG. 4 depicts an example cross-sectional view of a portion of one of the blocks of FIG. 5. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

FIG. 5 depicts a plot of memory hole diameter in the stack of FIG. 4. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 5). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 5). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and pillar, the programming and erase speed of the memory cells can vary based on their position along the memory hole. With a relatively smaller diameter portion of a memory hole, the electric field across the tunnel oxide is relatively stronger, so that the programming and erase speed is higher.

In another possible implementation, represented by the short dashed line, the stack is fabricated in two tiers. The stack can be fabricated in two or more tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Due to the non-uniformity in the width of the memory hole, the programming and erase speed of the memory cells can vary based on their position along the memory hole, e.g., based on their height in the stack. With a smaller diameter memory hole, the electric field across the tunnel oxide is relatively stronger, so that the programming and erase speed is relatively higher.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer 663 or film such as SiN or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7A depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time, e.g., SB0 first, followed by SB1, then SB2 and then SB3. Within each sub-block, a word line programming order may be followed, e.g., starting at WL0, the source-side word line and proceeding one word line at a time to WLL10, the drain-side word line.

The NAND strings 700n, 710n, 720n and 730n have channel regions 700a, 710a, 720a and 730a, respectively. The channels can have boosting levels such as discussed in connection with FIG. 8G.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

This figures shows a set of word lines (WL0-WL10); a selected string (700n) comprising a set of data memory cells 704-714 extending from a group 700s of one or more (e.g., two in this example) source-side word lines WLL0 and WLL1 at a source-side 700ss of the selected string to a drain-side data word line WLL10 at a drain-side 700ds of the selected string, and an unselected string (710n) of data memory cells 724-734 extending from the group of one or more source-side data word lines to the drain-side data word line. Each word line in the set of word lines is connected to a respective data memory cell in the selected string and to a respective data memory cell in the unselected string. Also, the set of data memory cells 704-714 extends from a group 700g of one or more (e.g., two in this example) source-side data memory cells 704 and 705 at the source-side 700ss of the selected string to a drain-side data memory cell 714 at the drain-side 700ds of the selected string.

FIG. 7B depicts additional detail of the sub-blocks SB0-SB3 of FIG. 7A. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3.

Figure 8A:
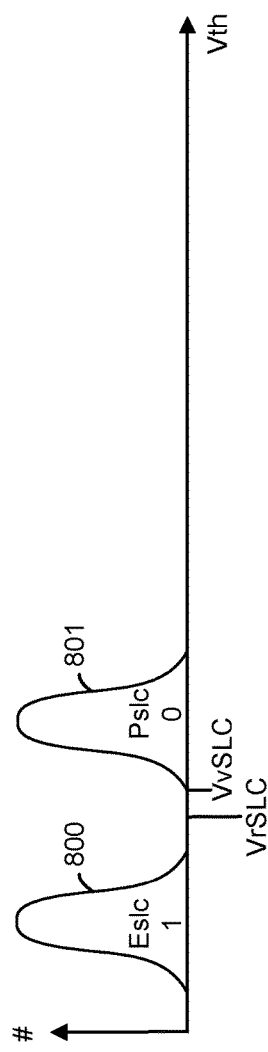
FIG. 8A depicts example Vth distributions of memory cells, where two data states are used.

FIG. 8A depicts example Vth distributions of memory cells, where two data states are used. During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

A Vth distribution 800 represents an erased state (Eslc) and a Vth distribution 801 represents a programmed data state (Pslc), in an example of single-level cell (SLC) programming. The erased state may represent a one bit while the programmed state represents a zero bit, for example. A verify voltage for the programmed state is VvSLC and a read voltage for distinguishing between the two states is VrSLC. Generally, a read voltage for distinguishing between adjacent states, e.g., a lower state and a higher state, should be located midway between the expected upper tail of the Vth distribution of the lower state and the expected lower tail of the Vth distribution of the higher state.

Figure 8B:
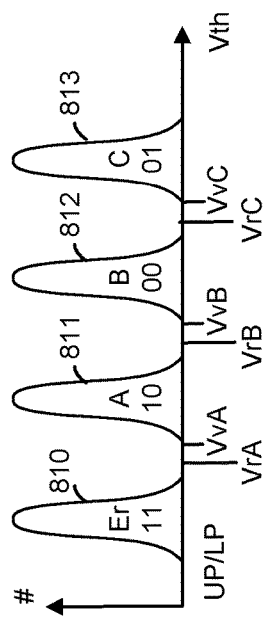
FIG. 8B depicts example Vth distributions of memory cells, where four data states are used.

FIG. 8B depicts example Vth distributions of memory cells, where four data states are used. The data states are represented by Vth distributions 810, 811, 812 and 813 for the Er, A, B and C states, respectively, and an example encoding of bits for each state is 11, 10, 00 and 01, respectively, in the format of upper page (UP) bit/lower page (LP) bit. The verify voltages are VvA, VvB and VvC, and the read voltages are VrA, VrB and VrC. A LP read may use VrA and VrC and an UP read may use VrB.

Figure 8C:
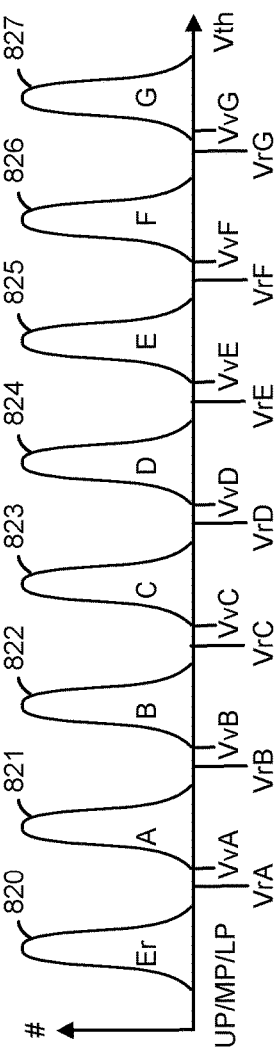
FIG. 8C depicts example Vth distributions of memory cells, where eight data states are used.

FIG. 8C depicts example Vth distributions of memory cells, where eight data states are used. The verify voltages of the A, B, C, D, E, F and G states are VvA, VvB, VvC, VvD, VvE, VvF and VvG, respectively. A first set of read voltages for the A, B, C, D, E, F and G states includes VrA, VrB, VrC, VrD, VrE, VrF and VrG, respectively. For the A, B, C, D, E, F and G states, an example encoding of bits for each state is 111, 110, 100, 000, 010, 011, 001 and 101, respectively. The data states are represented by Vth distributions 820, 821, 822, 823, 824, 825, 826 and 827 for the Er, A, B, C, D, E, F and G states, respectively.

Figure 8D:
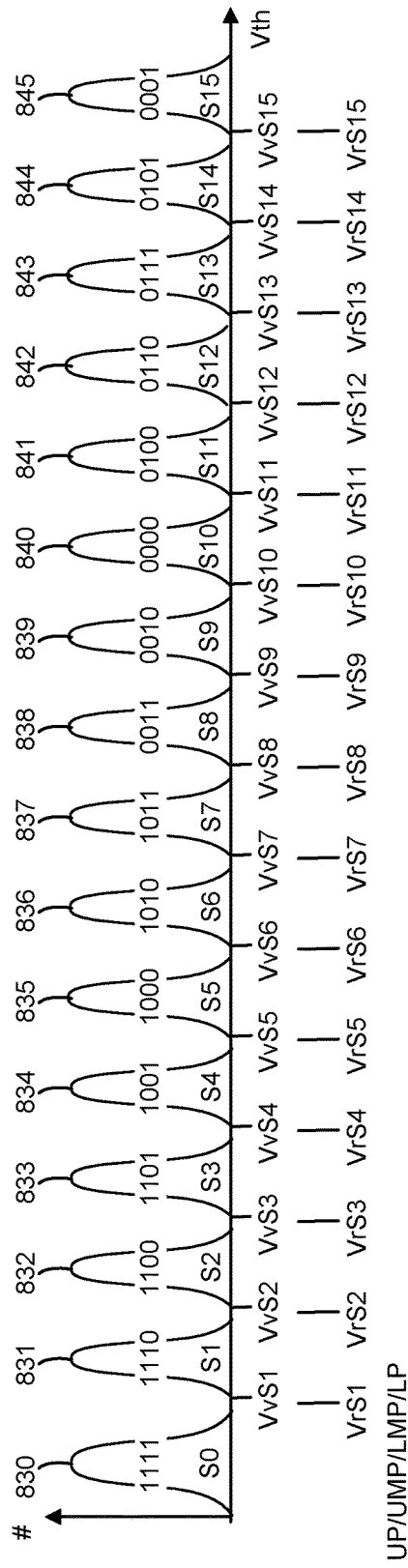
FIG. 8D depicts example Vth distributions of memory cells, where sixteen data states are used.

FIG. 8D depicts example Vth distributions of memory cells, where sixteen data states are used. Programming using four bits per cell (16 levels) can involve lower, lower-middle, upper-middle and upper pages.

The data states are represented by Vth distributions 830, 831, 832, 833, 834, 835, 836, 837, 838, 839, 840, 841, 842, 843, 844 and 845 for the S0, S1, S2, S3, S4, S5, S6, S7, S8, S9, S10, S11, S12, S13, S14 and S15 states, respectively, and an example encoding of bits for each state is 1111, 1110, 1100, 1101, 1001, 1000, 1010, 1011, 0011, 0010, 0000, 0100, 0110, 0111, 0101 and 0001, respectively, in the format of upper page (UP) bit/upper middle (UMP) page bit, lower middle (LMP) page bit, lower page (LP) bit, as depicted. The verify voltages are VvS1, VvS2, VvS3, VvS4, VvS5, VvS6, VvS7, VvS8, VvS9, VvS10, VvS11, VvS12, VvS13, VvS4 and VvS15. The read voltages are VrS1, VrS2, VrS3, VrS4, VrS5, VrS6, VrS7, VrS8, VrS9, VrS10, VrS11, VrS12, VrS13, VrS4 and VrS15.

A LP read may use VrS1, VrS3, VrS5, VrS7, VrS9 and VrS13. A LMP read may use VrS2, VrS6, VrS10, VrS12 and VrS14. An UMP read may use VrS4, VrS11 and VrS15. An UP read may use VrS8.

Figure 8F:
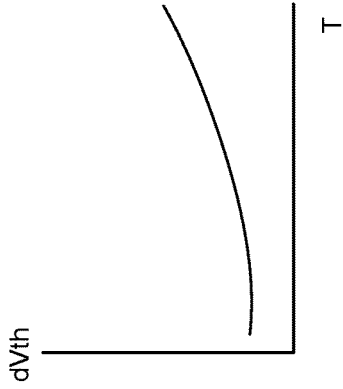
FIG. 8F depicts a plot of an increase in Vth (dVth) of memory cells versus temperature.
Figure 8E:
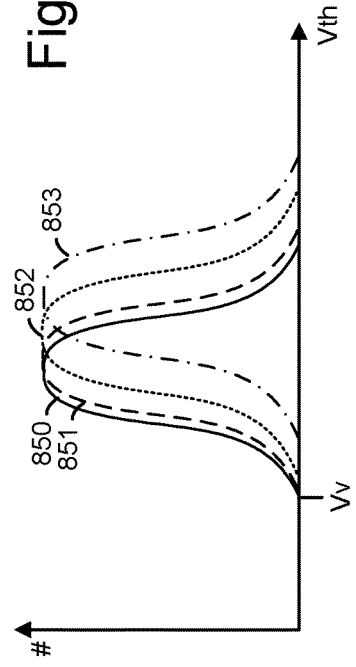
FIG. 8E depicts an example Vth distribution of memory cells for one data state, showing the effects of memory cell position and temperature.

FIG. 8E depicts an example Vth distribution of memory cells for one data state, showing the effects of memory cell position and temperature. In this example, a fixed Vpass, independent of temperature, is applied to the unselected word lines. A single programmed data state is shown as a simplification, but the principles apply to other data states as well. Vv is the verify voltage. The Vth distribution 850 is for memory cells which are not among one or more source-side memory cells, at a relatively low temperature. This is considered to be a reference Vth distribution. The Vth distribution 851 is for the memory cells which are not among the one or more source-side memory cells at a relatively high temperature. These cells experience a small upshift in Vth due to degraded channel boosting.

The Vth distribution 852 is for the one or more source-side memory cells at a relatively low temperature. This Vth distribution has a significant Vth upshift (compared to the memory cells which are not among one or more source-side memory cells) due to the source-side effects (e.g., hot carrier injection). The Vth distribution 853 is for the one or more source-side memory cells at a relatively high temperature. These cells experience a significant upshift in Vth due to a significant increase in hot carrier injection which occurs due to an increase in temperature. The techniques provided herein can reduce or avoid upshifts in Vth which occur due to an increase in temperature.

An additional upshift in the Vth of a memory cell could also be caused based on the number of programming operations which are performed using the respective word line of the memory cell. For example, in FIGS. 7A and 7B, as mentioned, the word lines extend across the sub-blocks and the programming proceeds one sub-block at a time. Accordingly, a set of program voltages is applied to the same word line when each sub-block is programmed. After memory cells in SB0 are programmed using a word line, memory cells in each of SB1-SB3 are also programmed. These additional program operations can cause upshifts in the Vth of the memory cells in SB0. The upshift in Vth for cells in a particular sub-block is proportional to a number of sub-blocks which are programmed after the particular sub-block. The magnitude of the decrease in Vpass in a particular sub-block can be proportional to a number of sub-blocks which are programmed after the particular sub-block.

FIG. 8F depicts a plot of an increase in Vth (dVth) of memory cells versus temperature. A memory device may be designed to operate in a temperature range of, e.g., −30 C to 85 C, where 25 C is considered to be room temperature. Vth increases exponentially so that the increase with temperature is relatively small at lower temperatures such as below room temperature and relatively large at higher temperatures such as above room temperature.

Figure 8G:
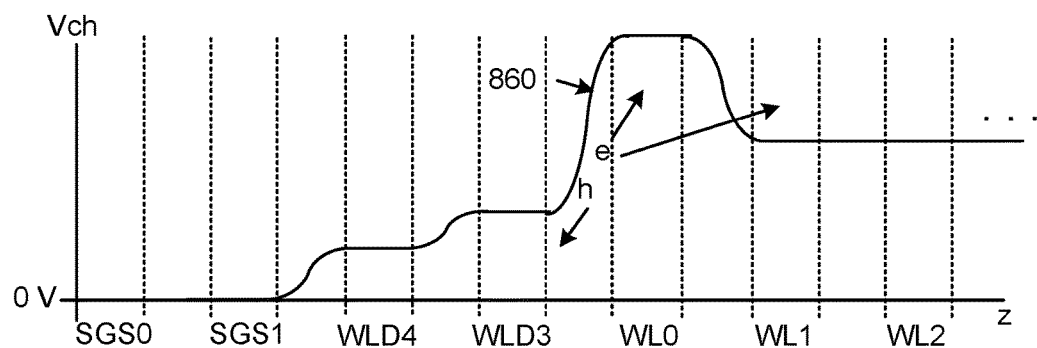
FIG. 8G depicts a plot of a channel voltage (Vch) in an unselected NAND string, where a channel gradient between the selected word line (WL0) and a dummy word line (WLD3) results in electron-hole generation.

FIG. 8G depicts a plot of a channel voltage (Vch) in an unselected NAND string, where a channel gradient between the selected word line (WL0) and a dummy word line (WLD3) at the source side of WL0) results in electron-hole generation. The vertical axis depicts Vch and the horizontal axis depicts locations along a channel of a string of cells such as a NAND string. The locations are sectioned off by vertical dashed lines, where the region between adjacent dashed lines corresponds to a channel region directly adjacent to a transistor/word line or to a channel region between transistors/word lines. A focus is on the source side of the string. The source line is to the left and the bit line is to the right. WL0 is the source-side data word line, WLD3 is a first dummy word line, adjacent to WL0 and WLD4 is a second dummy word line, adjacent to WLD3. WL1 is a data word line adjacent to WL0 and WL2 is a data word line adjacent to WL1.

The majority of the channel boosting in an unselected NAND string is due to capacitive coupling from the word lines to the channel while the channel voltage is floating. To float the channel voltage, the select gate transistors are turned off (made non-conductive). For example, 0 V may be applied to the control gates of the SGD and SGS transistors. WLD4 receives a voltage such as 3 V. WLD3 receives a voltage such as 5 V. WL0 receives a program voltage such as 15-25 V. WL1, WL2 and the other word lines receive a pass voltage such as 10 V. A rough estimate of the channel voltage is the word line voltage minus the Vth of the transistor. The dummy cells may have Vth=0 V, for instance. These cells are not programmed and have a fixed Vth. The SGS transistors may also have Vth=0 V, for instance. Moreover, when WL0 is initially programmed, the cells on WL0 and the other word lines are in the erased state and may also have Vth=0 V, for instance. As a result, the channel regions directly adjacent to SGS0, SGS1, WLD4, WLD3, WL0, WL1 and WL2 have Vch=0, 0, 3, 5, 15-25, 10 and 10 V, respectively.

A channel gradient 860 such as Vpgm-5 V (e.g., 15−5=10 V to 25−5=20 V) is formed between WLD3 and WL0. A smaller channel gradient is formed between WL0 and WL1. Pairs of electrons (e) and holes (h) are generated. The electrons can enter the charge trapping region of the cells connected to WL0, causing over-programming. The electrons can travel even further, entering the charge trapping region of the cells connected to WL1, for instance, also causing over-programming but to a lesser extent than for the cells of WL0. Moreover, as the program voltage (Vpgm) steps up, the gradient will increase further, increasing the likelihood of over-programming.

FIG. 9 depicts a waveform of an example programming operation. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages such as discussed in connection with FIG. 8A-8D.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 900 includes a series of program voltages 901, 902, 903, 904, 905, . . . 906 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 910) may be applied after each of the program voltages 901 and 902. A-, B- and C-state verify voltages of VvA, VvB and VvC (waveform 911) may be applied after each of the program voltages 903 and 904. After several additional program loops, not shown, E-, F- and G-state verify voltages of VvE, VvF and VvG (waveform 912) may be applied after the final program voltage 906.

Figure 10A:
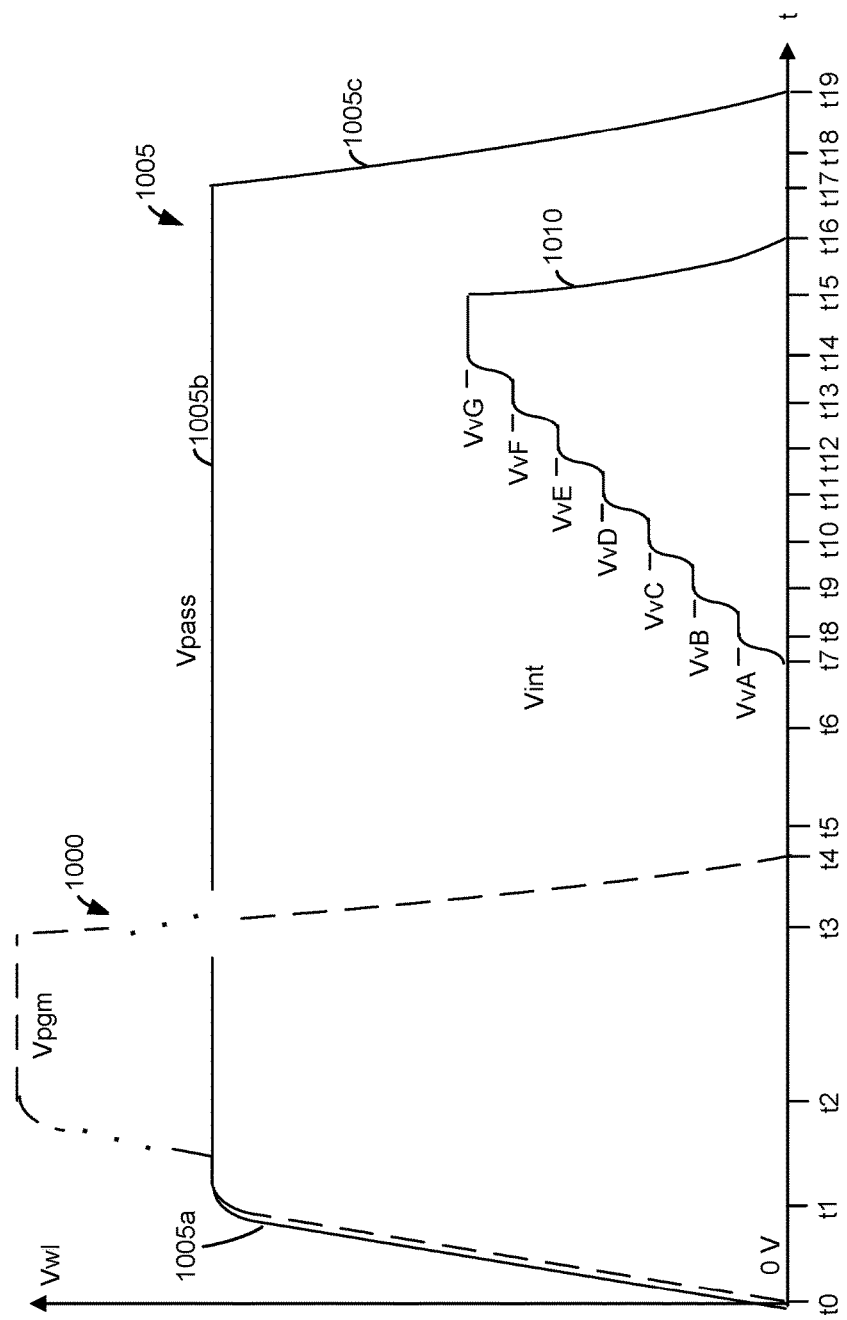
FIG. 10A depicts a plot of example waveforms in a programming operation.

FIG. 10A depicts a plot of example waveforms in a programming operation. The time period shown represents one program-verify iteration. The horizontal axis depicts time and the vertical axis depicts word line voltage, Vwl. A program voltage 1000 is applied to a selected word line from t0-t4 and reaches a magnitude of Vpgm. A pass voltage 1005 is applied to the unselected word lines from t5-t19 and reaches a magnitude of Vpass, which is sufficiently high to provide the cells in a conductive state so that the sensing (e.g., verify) operations can occur for the cells of the selected word line. The pass voltage includes an increasing portion 1005a, a fixed amplitude portion 1005b, for instance, at Vpass and a decreasing portion 1005c. The program voltage can temporarily pause at an intermediate level such as Vpass to avoid a single large transition which can have undesired coupling effects. Optionally, the pass voltage may be increased sooner so that Vpass is reached by to.

A verify voltage 1010 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The waveform decreases from VvG to 0 V or other steady state level from t15-t16.

FIG. 10B depicts a plot of example waveforms in a read operation. The horizontal axis depicts time and the vertical axis depicts word line voltage, Vwl. A pass voltage 1025 is applied to the unselected word lines from t0-14 and reaches a magnitude of Vpass. The pass voltage includes an increasing portion 1025a, a portion 1025b at Vpass and a decreasing portion 1025c. A read voltage 1030 is applied to the selected word line. In this example, all seven read voltages are applied, one after another. An eight-level memory device is used in this example. Read voltages of VrA, VrB, VrC, VrD, VrE, VrF and VrG are applied at t3, t4, t5, t6, t7, t8 and t9, respectively. The waveform decreases from VrG to 0 V from t10-t11.

Figure 11:
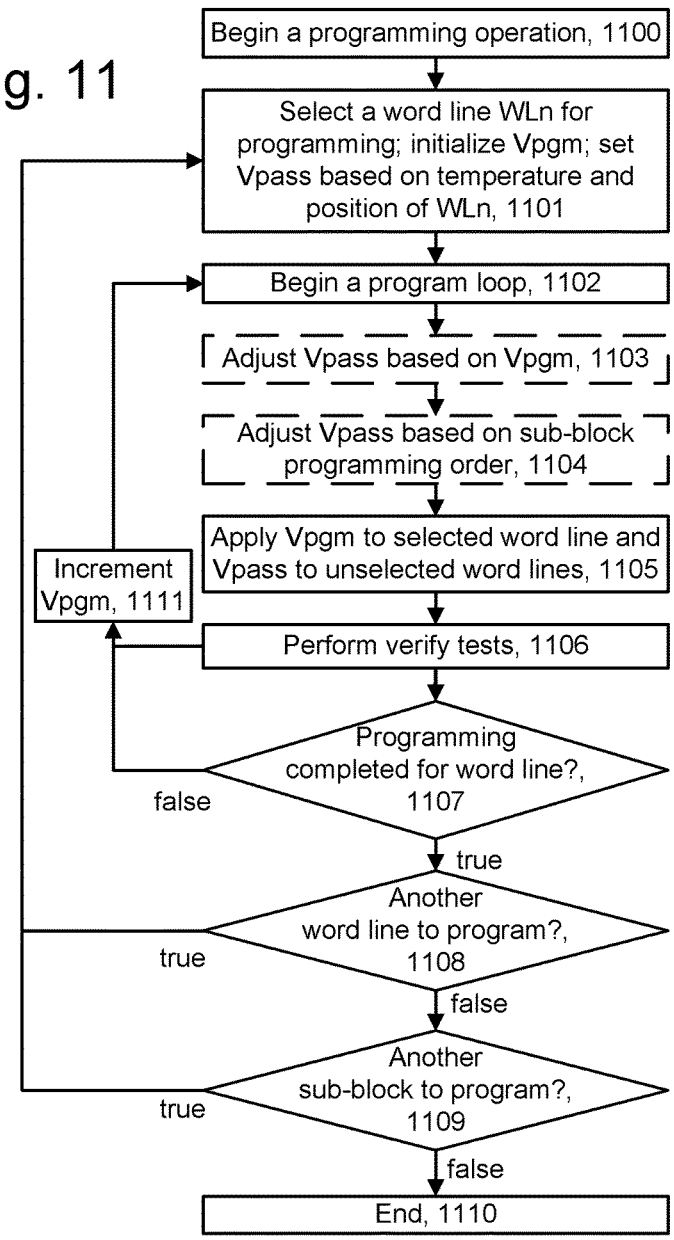
FIG. 11 depicts an example programming process which accounts for temperature and memory cell position.

FIG. 11 depicts an example programming process which accounts for temperature and memory cell position, e.g., selected word line position. Step 1100 begins a programming operation. Step 1101 selects a word line (WLn) for programming, initializes Vpgm and sets Vpass based on the temperature and the position of WLn, e.g., whether or not WLn is in a group of one or more source-side word lines. For example, in a string, the group can comprise a single cell which is the source-side cell, e.g., cell 704 in NAND string 700n in FIG. 7A. In another example, the group can comprise two cells including the source-side cell and the cell adjacent to it, on the drain side of the source-side cell. This adjacent cell may be cell 705 in NAND string 700n. The group of one or more source-side data memory cells in a selected string may comprise no more than 10% of the data memory cells in the selected string, for example. This group comprises cells which are most likely to be affect by over-programming. In one example, the group of one or more source-side data memory cells comprises no more than two or three cells. The source-side data memory cells in a selected string are adjacent to one another. Or, the group of one or more source-side data word lines may comprise no more than 10% of the word lines in a set of data word lines of a block or sub-block.

Step 1102 begins a program loop or program-verify iteration. Step 1103 may be used to adjust Vpass based on the magnitude of Vpgm. See, e.g., FIGS. 14A and 14B. Step 1104 may be used to adjust Vpass based on the sub-block programming order, as discussed. Step 1105 includes applying Vpgm to the selected word line and Vpass to the unselected word lines. These voltages are applied concurrently, at least in part. Step 1106 involves performing verify tests. In one approach, as described in FIG. 9, verify tests are performed for a subset of all target data states, for the memory cells which have not yet completed programming.

Decision step 1107 determines if programming is completed for the selected word line. Decision step 1107 is true if all, or nearly all of the memory cells which are to be programmed have passed their respective verify test. A memory cell passes a verify test when a verify voltage is applied to its control gate via a word line and the memory cell is determined by sensing circuitry to be in a non-conductive state. In this case, the Vth of the memory cell exceeds the verify voltage. If decision step 1107 is false, Vpgm is incremented at step 1111, and a next program loop is performed at step 1102. If decision step 1107 is true, decision step 1108 determines whether there is another word line to program, e.g., in the currently selected sub-block. If decision step 1108 is false, decision step 1109 determines whether there is another sub-block to program, e.g., in the currently selected block. If decision step 1108 is true, a next word line in the current sub-block is selected to be programmed at step 1101. If decision step 1109 is true, a first word line in the next sub-block is selected to be programmed at step 1101. If decision step 1109 is false, the programming operation ends at step 1110.

Figure 12:
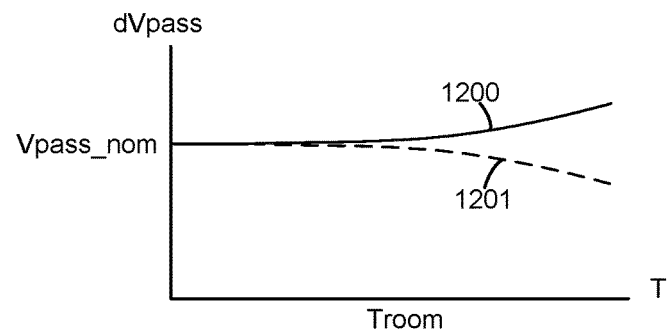
FIG. 12 depicts an example plot showing a change in Vpass (dVpass) versus temperature for memory cells of a group of one or more source-side word lines (plot 1201) and memory cells of remaining word lines (1200).

FIG. 12 depicts an example plot showing a change in Vpass (dVpass) versus temperature (T) for memory cells of a group of one or more source-side word lines (plot 1201) and memory cells of remaining word lines (1200). One solution to reducing over-programming of the memory cells of the group of one or more source-side word lines is to reduce Vpass on the remaining word lines as temperature increases. Thus, Vpass can decrease as T increases (plot 1201) when the selected word line is in the group of one or more source-side word lines. A magnitude of the pass voltage is inversely proportional to the temperature. In one approach, in this situation, Vpass begins to decrease from a nominal level, Vpass_nom when T>Troom, where Troom is room temperature. Vpass decreases according to a negative temperature coefficient in this situation.

On the other hand, Vpass can increase in proportion to T (plot 1200) when the selected word line is not in the group of one or more source-side word lines, since over-programming due to hot electron injection is less of a concern. The larger concern is the reduction in channel boosting at higher temperatures. A property of the polysilicon channel is that there is an increase in the generation of electrons with increasing temperature. The additional electrons are negative charges which decrease the channel voltage. To improve channel boosting at higher temperatures, Vpass can increase in proportion to T. In one approach, in this situation, Vpass begins to increase from Vpass_nom when T>Troom. Vpass increases according to a positive temperature coefficient in this situation. A magnitude of the pass voltage is proportional to the temperature.

Various implementations which adjust Vpass as a function of temperature are possible. Some implementations are discussed below. In FIG. 13A-13F, the vertical axis represents a word line voltage and the horizontal axis represents a position of a word line relative to a source-side (SS) and a drain-side (DS) of a set of word lines. Further, the data shows the case of a relatively low temperature, such as Troom and an elevated temperature, such as T>Troom. Each short horizontal line represents the voltage of one word line. The examples are consistent with FIGS. 4, 5, 7A and 7B, where there are eleven word lines, WL0-WL10. Further, WL0 is the selected word line in FIG. 13A to 13C, WL1 is the selected word line in FIGS. 13D and 13E, and WL2 is the selected word line in FIG. 13F. The selected word line receives the program voltage Vpgm and the unselected word lines receive a pass voltage Vpass. A "T" with an arrow shows how Vpass is adjusted with increasing temperature. For a given word line, Vpass can be adjusted to intermediate levels which are between the levels depicted in proportion to an increase in T.

In FIG. 13A to 13E, the selected word line is part of a group of one or more source-side word lines, so that Vpass decreases with increasing temperature. In FIG. 13F, the selected word line is not part of the group of one or more source-side word lines, so that Vpass increases with increasing temperature.

Figure 13A:
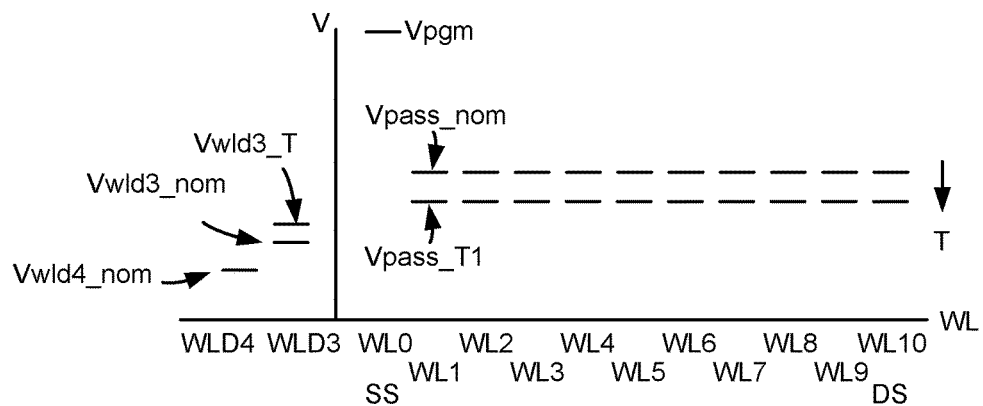
FIG. 13A depicts an example of pass voltages when WL0 is the selected word line and a reduced pass voltage Vpass_T1 is applied to the unselected word lines, when temperature is elevated.

FIG. 13A depicts an example of pass voltages when WL0 is the selected word line and a reduced pass voltage Vpass_T1 is applied to the unselected word lines, when temperature is elevated. This example also shows voltages of the dummy word lines WLD4 and WLD3. The voltage applied to WLD4 is Vwld4_nom, which is not adjusted with temperature, in this example. The voltage applied to WLD3 is Vwld3_nom when T is a nominal temperature such as Troom, or Vwld_T>Vwld3_nom when T is an elevated temperature. By increasing Vwld3 when temperature increases, the difference between Vwld3 and Vpgm decreases so that the voltage gradient in the channel between WLD3 and WL0 also decreases. These voltages of the dummy word lines WLD4 and WLD3 are not depicted but may be used in the examples of FIG. 13B to 13F as well.

This is an example of a group of one or more source-side data memory cells in a string being adjacent to a dummy memory cell at the source-side of the string. A control circuit is configured to set a control gate voltage of the dummy memory cell proportional to the temperature when the selected data memory cell is among the group of one or more source-side data memory cells in the string.

The voltage applied to WL0 is Vpgm since this is the selected word line. The voltage applied to WL1-WL10 is Vpass_nom if T is at a nominal level or VpassTl<Vpass_nom if T is at an elevated level. In this example, WL0 is part of a group of one or more source-side word lines.

Figure 13B:
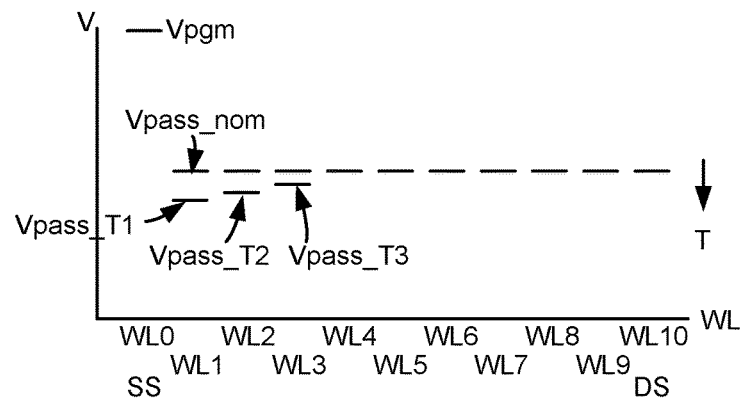
FIG. 13B depicts another example of pass voltages when WL0 is the selected word line, where different reduced pass voltages Vpass_T1, Vpass_T2 and Vpass_T3 are applied to some of the unselected word lines, and a nominal pass voltage Vpass_nom is applied to other unselected word lines, when temperature is elevated.

FIG. 13B depicts another example of pass voltages when WL0 is the selected word line, where different reduced pass voltages Vpass_T1, Vpass_T2 and Vpass_T3 are applied to some of the unselected word lines, and a nominal pass voltage Vpass_nom is applied to other unselected word lines, when temperature is elevated. In this example, WL0 is part of the group of one or more source-side word lines. Moreover, Vpass becomes progressively smaller for these word lines when the word line is closer to the source-side of the set of word lines. Vpass_T1, Vpass_T2 and Vpass_T3 are applied to WL1, WL2 and WL3, respectively. In other words, the adjustment to Vpass is greater for a word line which is relatively closer to the selected word line, WL0.

This approach is based on the theory that, among the word lines other than WL0, WL1 has the greatest coupling to the channel region associated with WL0. A relatively large reduction in the Vpass of WL1 will therefore have the greatest effect on reducing the voltage in the channel region associated with WL0. Vpass on WL2 and WL3 can be reduced by progressively smaller amounts due to the progressively increasing distance of WL0 to WL2 and WL3.

This is an example in which a magnitude of the pass voltage increases progressively with a distance from the source-side of the string when the selected data memory cell is among the group of one or more source-side data memory cells in the string.

For WL4-WL10, Vpass is not adjusted as a function of increasing temperature, in this example.

Figure 13C:
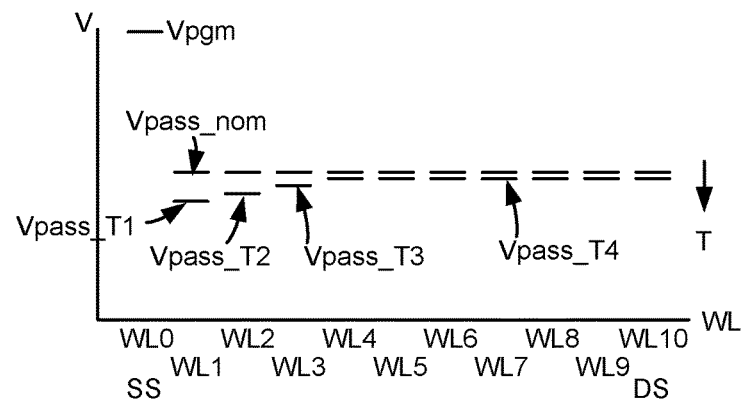
FIG. 13C depicts another example of pass voltages when WL0 is the selected word line, where different reduced pass voltage Vpass_T1, Vpass_T2 and Vpass_T3 are applied to some of the unselected word lines, and a reduced pass voltage Vpass_T4 is applied to other unselected word lines, when temperature is elevated.

FIG. 13C depicts another example of pass voltages when WL0 is the selected word line, where different reduced pass voltage Vpass_T1, Vpass_T2 and Vpass_T3 are applied to some of the unselected word lines, and a reduced pass voltage Vpass_T4<Vpass_nom is applied to other unselected word lines, when temperature is elevated. This example is similar to FIG. 13B except Vpass is also adjusted as a function of increasing temperature for WL4-WL10. A common reduced pass voltage, Vpass_T4 is applied to WL4-WL10. This approach is based on the theory that the word lines which are relatively far from the group of one or more source-side word lines can still have some effect on the voltage in the channel region associated with the group of one or more source-side word lines. Accordingly, reducing Vpass for these word lines is appropriate during elevated temperatures.

Figure 13D:
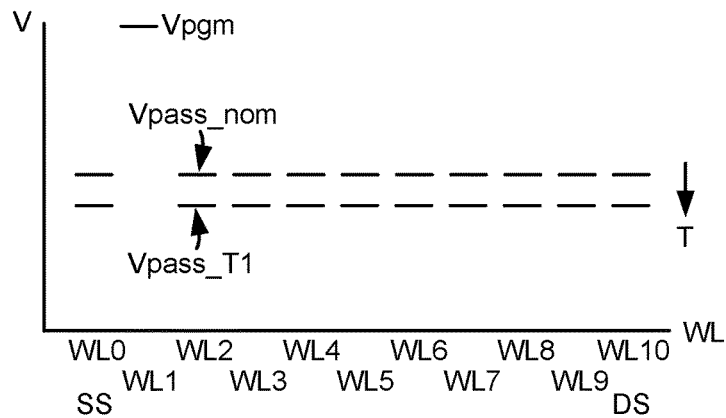
FIG. 13D depicts an example of pass voltages when WL1 is the selected word line and a reduced pass voltage Vpass_T1 is applied to the unselected word lines, when temperature is elevated.

FIG. 13D depicts an example of pass voltages when WL1 is the selected word line and a reduced pass voltage Vpass_T1 is applied to the unselected word lines, when temperature is elevated. Vpgm is applied to WL1, while Vpass_nom is applied to the remaining unselected word lines (e.g., WL0 and WL2-WL10) at nominal temperatures, and Vpass_T1 is applied to the remaining unselected word lines at elevated temperatures. Referring also to FIG. 13A, this example shows that the same pass voltage is applied when the selected word line is WL0 or WL1.

Figure 13E:
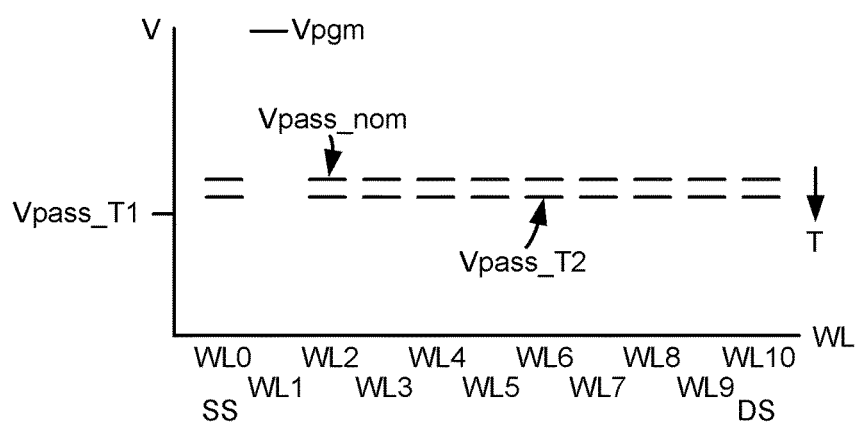
FIG. 13E depicts an example of pass voltages when WL1 is the selected word line and a reduced pass voltage Vpass_T2>Vpass_T1 is applied to the unselected word lines, when temperature is elevated.
Figure 13F:
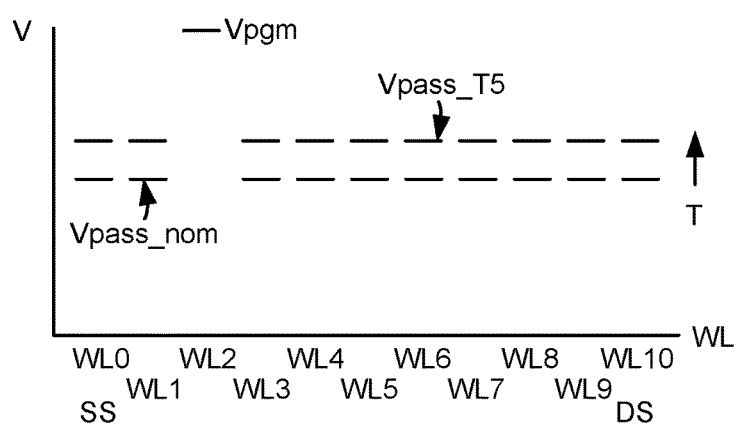
FIG. 13F depicts an example of pass voltages when WL3 is the selected word line and an increased pass voltage Vpass_T5>Vpass_nom is applied to the unselected word lines, when temperature is elevated.

FIG. 13E depicts an example of pass voltages when WL1 is the selected word line and a reduced pass voltage Vpass_T2>Vpass_T1 is applied to the unselected word lines, when temperature is elevated. Vpgm is applied to WL1, while Vpass_nom is applied to the remaining unselected word lines (e.g., WL0 and WL2-WL10) at nominal temperatures, and Vpass_T2 is applied to the remaining unselected word lines at elevated temperatures. Referring also to FIG. 13D, a lower pass voltage is applied when the selected word line is WL0 than when the selected word line is WL1, e.g., Vpass_T1<Vpass_T2. This approach is based on the theory that the channel gradient between WL1 and WL0 when WL1 is the selected word line is smaller than the channel gradient between WL0 and WLD3 when WL0 is the selected word line. Accordingly, the likelihood of overprogramming is smaller and the adjustment to Vpass can be smaller when WL1 is the selected word line than when WL0 is the selected word line. Generally, the decrease in Vpass from a nominal level can become progressively smaller when the selected word line in progressively further away from the source-side of the set of word lines.

FIGS. 13A and 13E provide an example in which a group of one or more source-side data memory cells in a string comprises a first data memory cell which is at a source-side of the string and a second data memory cell which is adjacent to the first data memory cell. A control circuit is configured to set the magnitude of the pass voltage to a first value (Vpass_T1) when the selected data memory cell is the first data memory cell and a second value (Vpass_T2), higher than the first value, when the selected data memory cell is the second data memory cell.

FIG. 13F depicts an example of pass voltages when WL3 is the selected word line and an increased pass voltage Vpass_T5>Vpass_nom is applied to the unselected word lines, when temperature is elevated. Here, the selected word line, WL2, is not part of the group of one or more source-side word lines. As a result, Vpass increases with increasing temperature, as discussed in connection with FIG. 12. Specifically, Vpass_nom is applied to the unselected word lines when the temperature is at a nominal level and Vpass_T5>Vpass_nom is applied to the unselected word lines when the temperature is at an elevated level. Vpgm is applied to WL2.

Figure 14A:
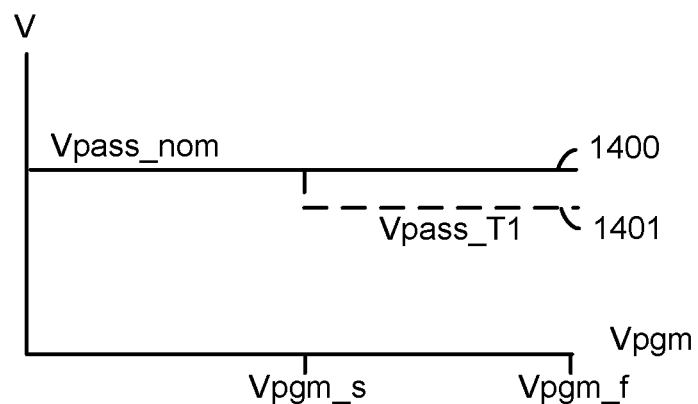
FIG. 14A depicts an example of pass voltages as a function of program voltage, for a nominal temperature (plot 1400) and an increased temperature (plot 1401).
Figure 14B:
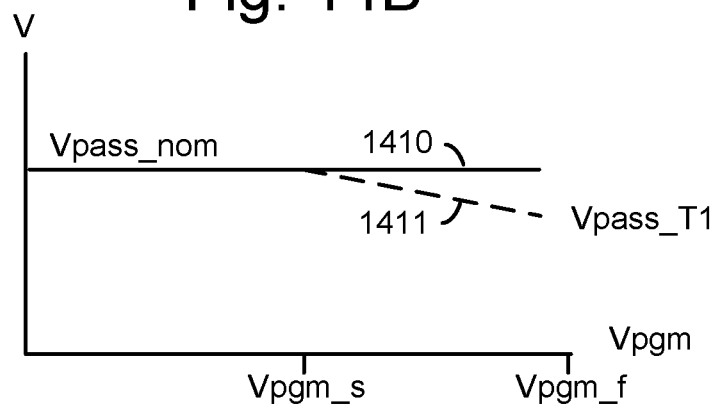
FIG. 14B depicts an example of pass voltages as a function of program voltage, for a nominal temperature (plot 1410) and an increased temperature (plot 1411).

FIG. 14A depicts an example of pass voltages as a function of program voltage, for a nominal temperature (plot 1400) and an increased temperature (plot 1401). In FIGS. 14A and 14B, the vertical axis depicts a voltage of unselected word lines, and the horizontal axis depicts Vpgm, which increases in steps in a program operation (FIG. 9). As mentioned, the channel gradient which can lead to over programming is worse when Vpgm is greater. Accordingly, the countermeasure of reducing Vpass can be a function of Vpgm. In this example, Vpass is reduced only when Vpgm exceeds a specified level, Vpgm_s, and when the temperature is elevated. Vpass is reduced from Vpass_nom to Vpass_T1 in a step change. Another approach is to reduce Vpass in multiple steps with an increase in temperature. The reduction in Vpass can be set based on a program loop number during a program operation, for example. Plots 1400 and 1401 represent the case of a nominal temperature and an elevated temperature, respectively. Vpgm_s is a voltage which is between an initial value of Vpgm and a final value of Vpgm in a programming pass, in one approach.

FIG. 14B depicts an example of pass voltages as a function of program voltage, for a nominal temperature (plot 1410) and an increased temperature (plot 1411). In this example, Vpass is reduced when Vpgm exceeds Vpgm_s. Moreover, Vpass is reduced from Vpass_nom to Vpass_T1 in a gradual change as Vpgm increases. Plots 1410 and 1411 represent the case of a nominal temperature and an elevated temperature, respectively.

Vpass can be adjusted as a function of Vpgm as well as word line position and temperature, as discussed.

Figure 15:
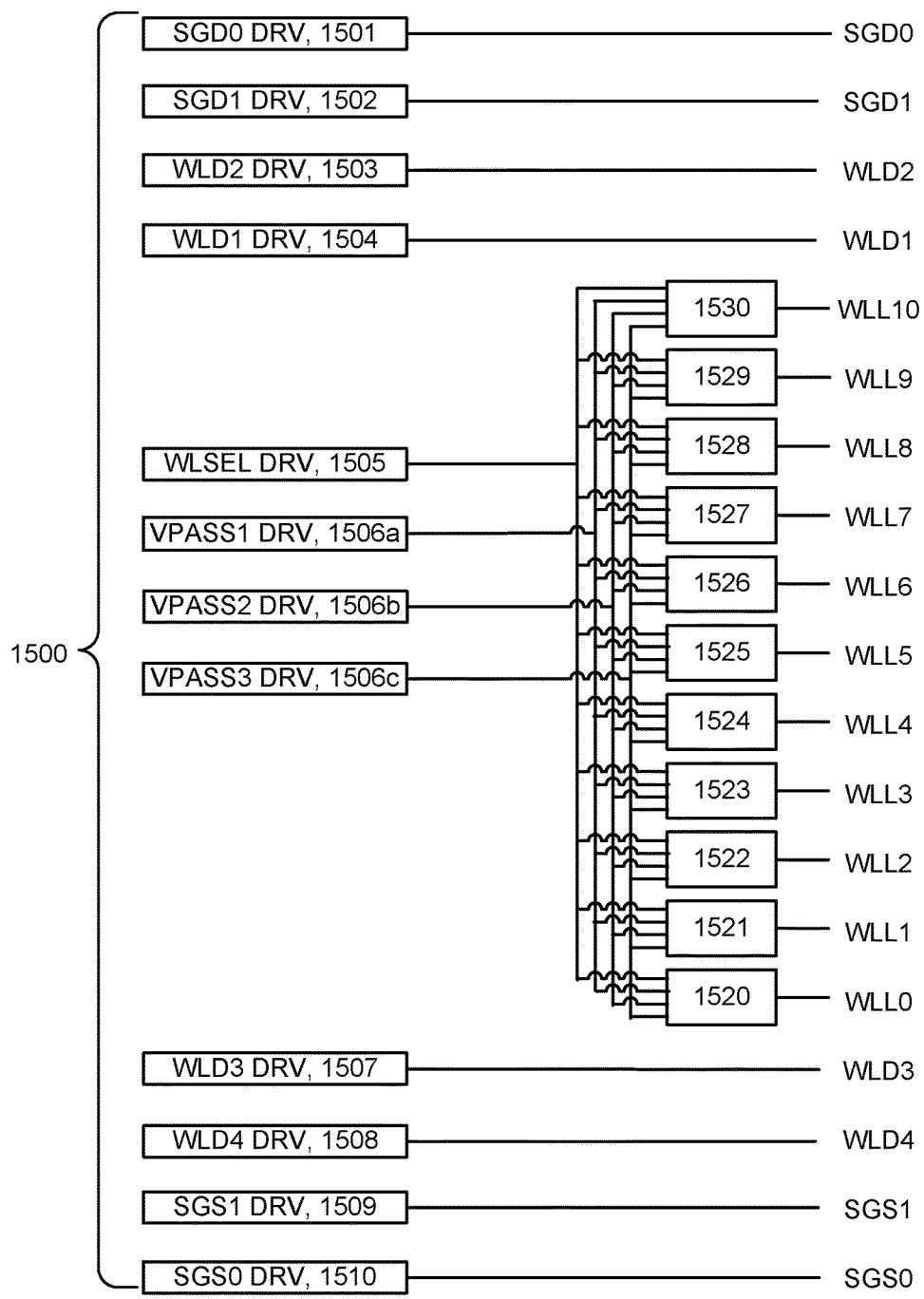
FIG. 15 depicts an example circuit which applies voltages to word lines and select gate lines in a block.

FIG. 15 depicts an example circuit which applies voltages to word lines and select gate lines in a block. The various voltage drivers 1500, such as charge pumps, may be provided as part of the power control module 116 of FIG. 1, for example. An SGD0 driver 1501 (DRV denotes driver) provides a voltage to an SGD0 control line. An SGD1 driver 1502 provides a voltage to an SGD1 control line. A WLD2 driver 1503 provides a voltage to a WLD2 word line. A WLD1 driver 1504 provides a voltage to a WLD1 word line. A WLSEL driver 1505 provides a voltage to any of the data word lines WLL0-WLL10 which is selected, e.g., for programming or reading. For example, this can be a program voltage, a verify voltage or a read voltage. One or more pass voltage drivers can be used to provide one or more pass voltages concurrently to different unselected word lines. These include examples drivers VPASS1 DRV 1506a, VPASS2 DRV 1506b and VPASS3 DRV 1506c. The pass voltage drivers provide a voltage to any of the data word lines WLL0-WLL10 which are not selected for programming or reading. For instance, in the example of FIG. 13B, VPASS1 DRV 1506a, VPASS2 DRV 1506b and VPASS3 DRV 1506c could be used to provide Vpass_T1, Vpass_T2 and Vpass_T3, respectively.

A WLD3 driver 1507 provides a voltage to a WLD3 word line. A WLD4 driver 1508 provides a voltage to a WLD4 word line. An SGS1 driver 1509 provides a voltage to an SGS1 control line. An SGS0 driver 1510 provides a voltage to an SGS0 control line.

A set of switches 1520-1530 are responsive to control signals to pass the voltage from one of the drivers 1505, 1506a, 1506b and 1506c to the respective data word line. Switches 1520, 1521, 1522, 1523, 1524, 1525, 1526, 1527, 1528, 1529 and 1530 are used for word lines WLL0-WLL10, respectively. The switches can also be controlled to disconnect a driver from the respective data word line to float the voltage of the data word line.

Accordingly, it can be seen that, in one embodiment, an apparatus comprises: a set of word lines; a string comprising a set of data memory cells extending from a group of one or more source-side data memory cells at a source-side of the string to a drain-side data memory cell at a drain-side of the string, wherein the string is among a plurality of strings of memory cells; a temperature-sensing circuit configured to provide data indicative of a temperature; and a control circuit. The control circuit, to program a selected data memory cell in the set of data memory cells in the string, where the selected data memory cell is connected to a selected word line in the set of word lines, is configured to concurrently apply a program voltage to the selected word line and apply a pass voltage to unselected word lines in the set of word lines, and to set a magnitude of the pass voltage inversely proportional to the temperature when the selected data memory cell is among the group of one or more source-side data memory cells in the string and proportional to the temperature than when the selected data memory cell is not among the group of one or more source-side data memory cells in the string.

In another embodiment, a method comprises obtaining data indicative of a temperature; and concurrently applying a program voltage to a selected word line and a pass voltage to unselected word lines, wherein a selected data memory cell is connected to the selected word line and, when the temperature is above a specified level, a magnitude of the pass voltage is lower when the selected data memory cell is among a group of one or more source-side data memory cells in a string than when the selected data memory cell is not among the group of one or more source-side data memory cells in the string.

In another embodiment, an apparatus comprises means for means for concurrently applying a program voltage to a selected word line of a block; and means for applying, during the program voltage, a pass voltage to unselected word lines of the block, wherein when the temperature is above a specified level, a magnitude of the pass voltage is lower when the selected word line is among a group of one or more source-side data word lines than when the selected word line is not among the group of one or more source-side data word lines.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of word lines;
a string comprising a set of data memory cells extending from a group of one or more source-side data memory cells at a source-side of the string to a drain-side data memory cell at a drain-side of the string, wherein the string is among a plurality of strings of memory cells;
a temperature-sensing circuit configured to provide data indicative of a temperature; and
a control circuit, the control circuit, to program a selected data memory cell in the set of data memory cells in the string, where the selected data memory cell is connected to a selected word line in the set of word lines, is configured to concurrently apply a program voltage to the selected word line and apply a pass voltage to unselected word lines in the set of word lines, and to set a magnitude of the pass voltage inversely proportional to the temperature when the selected data memory cell is among the group of one or more source-side data memory cells in the string and proportional to the temperature when the selected data memory cell is not among the group of one or more source-side data memory cells in the string; wherein:
the group of one or more source-side data memory cells in the string comprises a first data memory cell which is at a source-side of the string and a second data memory cell which is adjacent to the first data memory cell; and
the control circuit is configured to set the magnitude of the pass voltage to a first value when the selected data memory cell is the first data memory cell and a second value, higher than the first value, when the selected data memory cell is the second data memory cell.

2. The apparatus of claim 1, wherein:
a magnitude of the pass voltage increases with a distance from the source-side of the string when the selected data memory cell is among the group of one or more source-side data memory cells in the string.

3. The apparatus of claim 1, wherein:
the control circuit is configured to set the magnitude of the pass voltage inversely proportional to a magnitude of the program voltage when the selected data memory cell is among the group of one or more source-side data memory cells.

4. The apparatus of claim 1, wherein:
the group of one or more source-side data memory cells in the string is adjacent to a dummy memory cell at the source-side of the string; and
the control circuit is configured to set a control gate voltage of the dummy memory cell proportional to the temperature when the selected data memory cell is among the group of one or more source-side data memory cells in the string.

5. The apparatus of claim 1, wherein:
the group of one or more source-side data memory cells in the string comprises no more than 10% of the set of data memory cells in the string.

6. The apparatus of claim 1, wherein:
the string extends vertically in a three-dimensional memory device.

7. The apparatus of claim 1, wherein:
the magnitude of the pass voltage is sufficiently high to provide data memory cells connected to the unselected word lines in a conductive state.

8. The apparatus of claim 1, wherein:
the set of word lines extend in sub-blocks of memory cells;
the control circuit is configured to program the sub-blocks in a sub-block programming order; and
the magnitude of the pass voltage is adjusted based on when a sub-block of the selected string is programmed in the sub-block programming order.

9. A method, comprising:
obtaining data indicative of a temperature; and
concurrently applying a program voltage to a selected word line and a pass voltage to unselected word lines, wherein a selected data memory cell is connected to the selected word line and, when the temperature is above a specified level, a magnitude of the pass voltage is lower when the selected data memory cell is among a group of one or more source-side data memory cells in a string than when the selected data memory cell is not among the group of one or more source-side data memory cells in the string.

10. The method of claim 9, wherein:
when the temperature is below the specified level, the magnitude of the pass voltage is independent of whether the selected data memory cell is among the group of one or more source-side data memory cells.

11. The method of claim 9, wherein:
when the temperature is above the specified level, the magnitude of the pass voltage is inversely proportional to the temperature when the selected data memory cell is among the group of one or more source-side data memory cells in the string.

12. The method of claim 9, wherein:
when the temperature is above the specified level, the magnitude of the pass voltage is proportional to the temperature when the selected data memory cell is not among the group of one or more source-side data memory cells in the string.

13. The method of claim 9, wherein the group of one or more source-side data memory cells in the string is adjacent to a dummy memory cell at the source-side of the string, the method further comprising, when the temperature is above the specified level:
setting a magnitude of a control gate voltage of the dummy memory cell higher when the selected data memory cell is among the group of one or more source-side data memory cells in the string than when the selected data memory cell is not among the group of one or more source-side data memory cells in the string.

14. The method of claim 9, wherein the group of one or more source-side data memory cells in the string comprises a first data memory cell which is at a source-side of the string and a second data memory cell which is adjacent to the first data memory cell, the method further comprising, when the temperature is above the specified level:
setting the magnitude of the pass voltage to a first value when the selected data memory cell is the first data memory cell and a second value, higher than the first value, when the selected data memory cell is the second data memory cell.

15. The method of claim 9, further comprising:
setting the magnitude of the pass voltage inversely proportional to a magnitude of the program voltage when the selected data memory cell is among the group of one or more source-side data memory cells.

16. An apparatus, comprising:

means for concurrently applying a program voltage to a selected word line of a block; and means for applying, during the program voltage, a pass voltage to unselected word lines of the block, wherein when a temperature is above a specified level, a magnitude of the pass voltage is lower when the selected word line is among a group of one or more source-side data word lines than when the selected word line is not among the group of one or more source-side data word lines.

17. The apparatus of claim 16, wherein:

when the temperature is above the specified level, the magnitude of the pass voltage decreases with an increase in the temperature when the selected word line is among the group of one or more source-side data word lines.

18. The apparatus of claim 16, wherein:

when the temperature is above the specified level, the magnitude of the pass voltage increases with an increase in the temperature when the selected word line is not among the group of one or more source-side data word lines.

19. The apparatus of claim 16, wherein:

the magnitude of the pass voltage is inversely proportional to a magnitude of the program voltage when the selected word line is among the group of one or more source-side data word lines.

\* \* \* \* \*